United States Patent
Katoh

(10) Patent No.: US 9,702,942 B2
(45) Date of Patent: Jul. 11, 2017

(54) MEASUREMENT DEVICE, SEMICONDUCTOR DEVICE AND IMPEDANCE ADJUSTMENT METHOD

(71) Applicant: NEC Corporation, Minato-ku, Tokyo (JP)

(72) Inventor: Toshihiro Katoh, Tokyo (JP)

(73) Assignee: NEC CORPORATION, Tokyo (JP)

( * ) Notice: Subject to any disclaimer, the term of this patent is extended or adjusted under 35 U.S.C. 154(b) by 92 days.

(21) Appl. No.: 14/492,215

(22) Filed: Sep. 22, 2014

(65) Prior Publication Data
US 2015/0084717 A1 Mar. 26, 2015

(30) Foreign Application Priority Data
Sep. 26, 2013 (JP) .................. 2013-200206

(51) Int. Cl.
*G01R 31/40* (2014.01)
*G05F 1/625* (2006.01)
*G01R 31/28* (2006.01)

(52) U.S. Cl.
CPC ............. *G01R 31/40* (2013.01); *G05F 1/625* (2013.01); *G01R 31/2848* (2013.01)

(58) Field of Classification Search
CPC .... G01N 3/08; G01R 23/005; G01R 19/0084; G01R 31/40; H01L 31/147; H01L 29/78
USPC ................ 324/709–714, 416, 500, 522
See application file for complete search history.

(56) References Cited

U.S. PATENT DOCUMENTS

| | | | | |
|---|---|---|---|---|
| 8,044,648 B1* | 10/2011 | Kahn | .................... | H02M 3/156 323/282 |
| 2001/0015882 A1* | 8/2001 | Yanagawa | .......... | H03K 19/0005 361/113 |
| 2011/0074385 A1* | 3/2011 | Sunaga | .............. | G01R 31/3016 324/76.11 |
| 2011/0181308 A1* | 7/2011 | Ishida | .............. | G01R 31/31721 324/750.02 |
| 2012/0091814 A1* | 4/2012 | Koshin | .................. | H02J 1/102 307/66 |

FOREIGN PATENT DOCUMENTS

| | | |
|---|---|---|
| JP | 2007-221046 A | 8/2007 |
| JP | 2009-94133 A | 4/2009 |
| JP | 2009-99718 A | 5/2009 |
| JP | 2010-48649 A | 3/2010 |
| JP | 2011-191192 A | 9/2011 |
| WO | 2007/108383 A1 | 9/2007 |

OTHER PUBLICATIONS

Japanese Office Action for JP Application No. 2013-200206 mailed on Oct. 21, 2014 with English Translation.

* cited by examiner

*Primary Examiner* — Melissa Koval
*Assistant Examiner* — Trung Nguyen

(57) ABSTRACT

A measurement device includes an electric current generation circuit and a monitor device. The electric current generation circuit supplies an electric current whose electric current amount monotonically increases during a setup period of time to the electric circuit including a power supply. The monitor device detects a voltage of the power supply via the electric circuit. A frequency of the detected voltage having a waveform is a frequency at which the impedance of the electric circuit becomes high.

7 Claims, 11 Drawing Sheets

MEASUREMENT DEVICE, SEMICONDUCTOR DEVICE AND IMPEDANCE ADJUSTMENT METHOD

This application is based upon and claims the benefit of priority from Japanese Patent Application No. 2013-200206, filed on Sep. 26, 2013, the disclosure of which is incorporated herein in its entirety by reference.

TECHNICAL FIELD

The present invention relates to a technology to adjust the impedance of an electric circuit (for example, a power distribution network (PDN)).

BACKGROUND ART

A power distribution network (PDN) includes a large scale integration (LSI), a package (PKG) (each being a package of electronic parts), a circuit board (a printed circuit board), a power supply and the like. For such the PDN, it is an essential work to adjust the impedance (power source impedance) thereof. This is because a level of power source noise arising inside a PDN becomes larger due to resonances which arise depending on relation between frequency element contained in an electric current flowing through the LSI (semiconductor integration circuit) constituting the PDN and frequency of which the power source impedance becomes high. In case that the level of the power source noise becomes larger, a signal-to-noise (SN) ratio of a signal outputted from the LSI (semiconductor integration circuit) included in the PDN becomes worse.

Thus, in order to reduce the level of the power source noise which arises inside the PDN, there has been employed a method in which the level of the power source noise is measured for each of various (exhaustive) combinations of capacitors of different capacitances with operation patterns of the LSI (semiconductor integration circuit), and then, one of the combinations which reduces the level of the power source noise to the greatest degree is selected based on the measurement result.

In addition, Japanese Unexamined Patent Application Publication 2009-99718 discloses a circuit configuration which is intended to, in a semiconductor integration circuit, reduce the level of power source noise which arises due to relations between operation frequency of the circuit and resonance frequency of power source wirings in the circuit. Japanese Unexamined Patent Application Publication 2010-48649 discloses a semiconductor integration circuit that includes a power source noise generation circuit for use in testing.

Nevertheless, in such the method as described above, in which power source noise is measured for each of combinations of capacitors of different capacitances and operation pattern of the LSI constituting the PDN, and then, one of the combinations which reduces the level of the power source noise to the greatest degree is selected based on the measurement result, there is a problem described below. That is, because of a large number of operation patterns of the LSI constituting the PDN as well a large number of capacitors, the number of combinations of the operation patterns of the LSI and the capacitors becomes enormous. For this reason, there is a problem that, in order to obtain a combination which reduces the level of the power source noise, a huge amount of time and expenses are incurred.

SUMMARY

A main object of the present invention is to provide a technology which enables realization of an efficient adjustment of an impedance of an electric circuit.

A measurement device of the present invention, as an aspect, includes:

an electric current generating circuit that supplies a measurement-target electric circuit including a power supply with an electric current whose electric current amount monotonically increases during a setup period of time; and a monitoring device that detects a voltage of the power supply via the electric circuit.

An impedance adjustment method of the present invention, as an aspect, includes:

detecting a frequency of which an impedance of a measurement-target electric circuit becomes high, based on a voltage detected by a monitoring device included in a measurement device of the present invention; and adjusting the impedance of the measurement-target electric circuit by utilizing a simulation so that the detected frequency and a driving frequency of the measurement-target electric circuit are different.

BRIEF DESCRIPTION OF THE DRAWINGS

Exemplary features and advantages of the present invention will become apparent from the following detailed description when taken with the accompanying drawings in which.

EXEMPLARY EMBODIMENT

Figure 1:
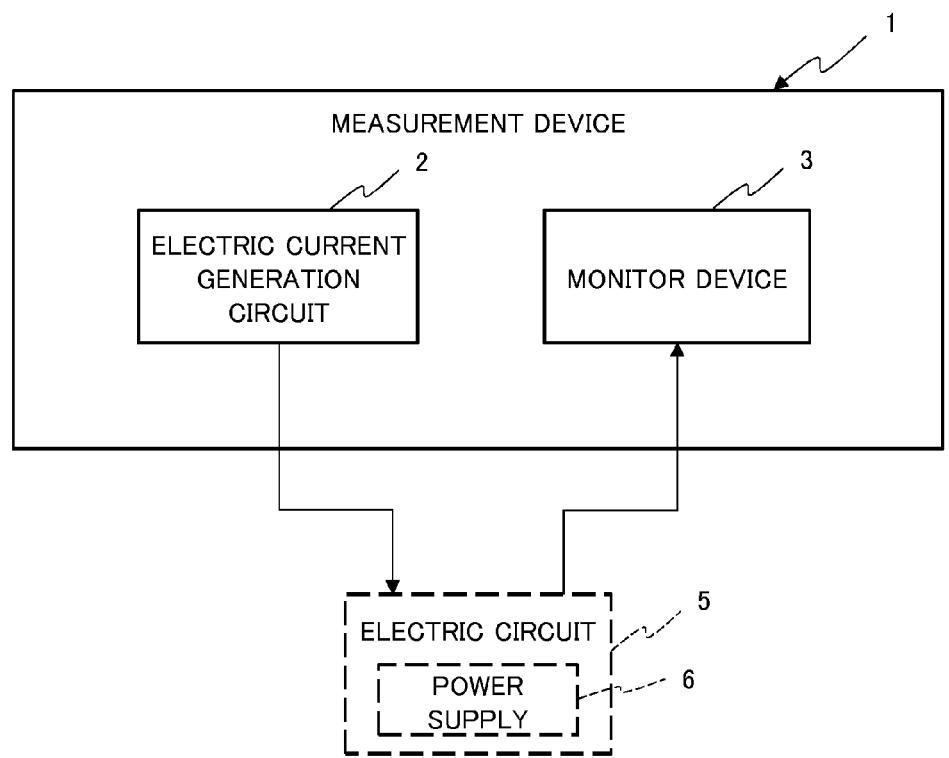
FIG. 1 is a simplified block diagram illustrating a configuration of a measurement device in a first exemplary embodiment according to the present invention.
Figure 2:
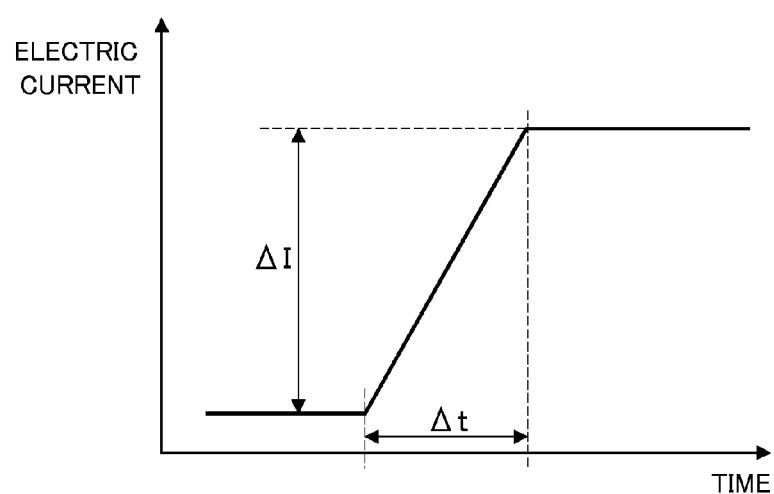
FIG. 2 is a diagram to describe an example of an electric current outputted from an electric current generation circuit.

Hereinafter, exemplary embodiments according to the present invention will be described.
<First Exemplary Embodiment>
FIG. 1 is a simplified block diagram illustrating a configuration of a measurement device according to a first exemplary embodiment of the present invention. A measurement device 1 of this first exemplary embodiment includes an electric current generation circuit 2 and a monitor device 3. This measurement device 1 is a device to measure an impedance of an electric circuit 5 including a power supply 6. The electric current generation circuit 2 includes a circuit configured to supply an electric current described below to the electric circuit 5 which is a measurement target to the measurement device 1. The electric current supplied to the electric circuit 5 by the electric current generation circuit 2 is an electric current, as shown in FIG. 2, whose electric current amount monotonically increases during a setup period of time Δt.

Figure 3:
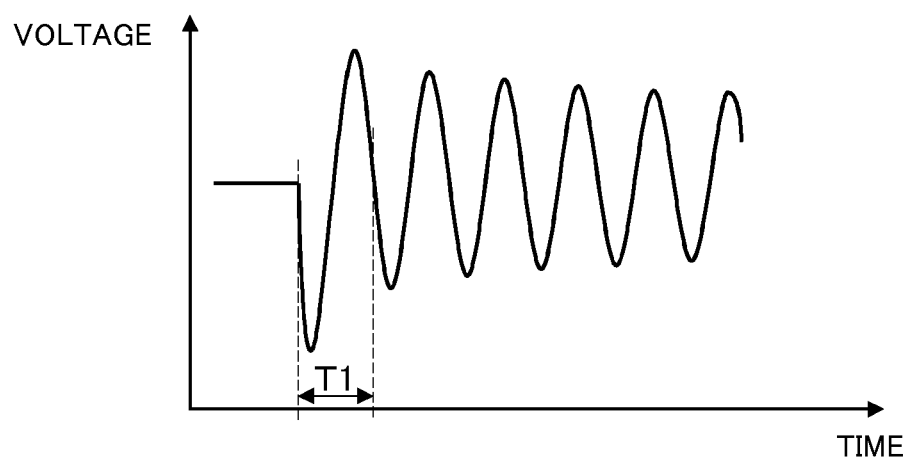
FIG. 3 is a diagram to describe an example of a waveform of a power source voltage detected by a monitor device.
Figure 4:
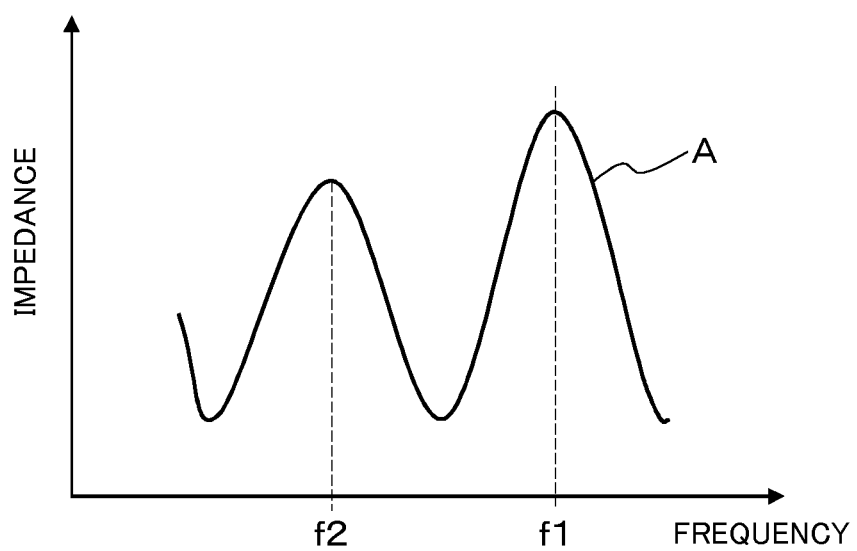
FIG. 4 is a graph illustrating a relation between a frequency and an impedance of a measurement-target electric circuit.

The monitor device 3 includes a circuit configured to detect a voltage of the power supply 6 via the electric circuit 5. Under such a configuration, along with a frequency variation, a magnitude of the impedance of the electric circuit 5 varies due to anti-resonances caused by parallel connection of capacitors (not illustrated) constituting the electric circuit 5. Here, it is supposed that the variation of the magnitude of the impedance of the electric circuit 5 is represented by a curve line A in an example shown in FIG. 4. That is, in the example of FIG. 4, the impedance of the electric circuit 5 becomes high at each of frequencies f1 and f2. In such a case, in case that the electric current generation circuit 2 supplies the electric circuit 5 with such the electric current whose amount monotonically increases, the monitor device 3 detects a voltage, such as a voltage shown in FIG. 3, having a waveform of which periodically varies due to a resonance between the supplied electric current and the electric circuit 5. A frequency f (f=1/T1 (=1÷T1)) of the detected voltage having such a waveform is a frequency at which the impedance of the electric circuit 5 becomes high.

Figure 5A:
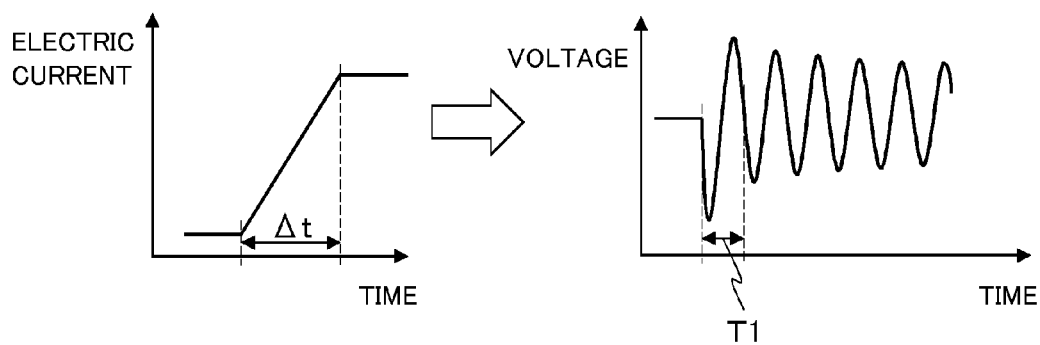
FIG. 5A is a diagram to describe a relation between the electric current outputted by the electric current generation circuit and the waveform of the voltage detected by the monitor device.
Figure 5B:
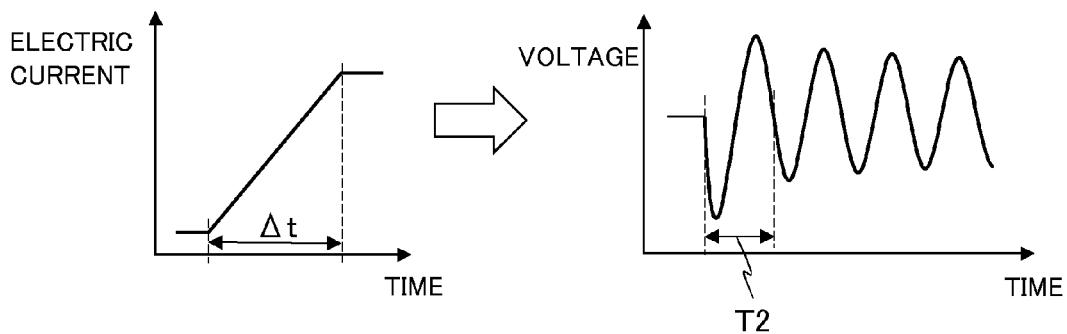
FIG. 5B is a diagram to describe a relation between the electric current outputted by the electric current generation circuit and the waveform of the voltage detected by the monitor device.

In addition, a frequency range of electric current element included in the monotonically increasing electric current is changed by adjusting the period of time Δt in which the electric current monotonically increases. That is, the monotonically increasing electric current includes electric current element of high frequency in the case where the period of time Δt is short; while the monotonically increasing electric current includes electric current element of low frequency in the case where the period of time Δt is long. Here, for example, it is supposed that, as shown in FIG. 5A, there is a relation between the period of time Δt and the frequency f (f=1/T1) of the waveform of the voltage detected by the monitor device 3. In this case, as shown in FIG. 5B, when the period of time Δt is made longer than the period of time Δt of FIG. 5A, a frequency f (f=1/T2 (=1÷T2)) of the waveform of the voltage detected by the monitor device 3 becomes lower than the frequency of the voltage waveform shown in FIG. 5A. Through the use of this mechanism, it is possible to obtain the frequency f1 (refer to FIG. 4) at which the impedance of the electric circuit 5 becomes high by, for example, making the period of time Δt short, as shown in FIG. 5A. Meanwhile, it is possible to obtain the frequency f2 (refer to FIG. 4) which is lower than the frequency f1 and at which the impedance of the electric circuit 5 becomes high by making the period of time Δt long, as shown in FIG. 5B.

As described above, the measurement device 1 of this first exemplary embodiment can obtain frequency of which the impedance of the measurement-target electric circuit 5 becomes high with a simple configuration. When the frequency obtained in such a way described above matches with an operation frequency of the electric circuit 5, a frequency n times the operation frequency thereof and a frequency 1/n (one-nth) times the operation frequency thereof (n being a positive integer), the level of noise contained in the electric current flowing through the electric circuit 5 becomes larger. When taking into consideration this phenomenon, in order to suppress increasing of the level of the noise contained in the electric current flowing through the electric circuit 5, it is preferable that the frequency obtained by the measurement device 1 (the monitor device 3) does not match with the operation frequency of the electric circuit 5, the frequency n times the operation frequency thereof and the frequency 1/n times the operation frequency thereof. Thus, for example, so that the frequency obtained by the measurement device 1 does not match with the operation frequency of the electric circuit 5, the frequency n times the operation frequency thereof and the frequency 1/n times the operation frequency thereof, a circuit designer changes combinations of components constituting the electric circuit 5, such as capacitors and inductors, by utilizing, for example, a simulation result. In other words, a circuit designer adjusts the impedance of the electric circuit 5. In this way, the level of the noise superimposed on the electric current as well as signal with respect to the electric circuit 5 is reduced.

In this first exemplary embodiment, as described above, the level of the noise arising in the electric circuit 5 is reduced by adjusting the impedance of the electric circuit 5 while focusing attention on the frequency of the voltage. Such a method of reducing the level of the noise arising (i.e., a method of adjusting the impedance) in this first exemplary embodiment makes it possible to improve the efficiency of work to a greater degree as compared with such a method of reducing the level of the noise arising in the electric circuit 5 while changing a large number of components configuring the electric circuit 5.

In addition, in the case where, for example, the electric circuit 5 is a circuit including a semiconductor integration circuit (LSI), the measurement device 1 of this first exemplary embodiment may be installed inside a semiconductor device including the electric circuit 5. In this case, it is possible to flow an electric current of high frequency into the semiconductor integration circuit of being the measurement-target electric circuit 5 from the measurement device 1 (the electric current generation circuit 2). Through this configuration, the measurement device 1 can obtain a measurement result with respect to power source noise in a high-frequency band. That is, through this measurement result, the measurement device 1 makes it possible to deal with power source noise falling within a wider frequency range.

\<Second Exemplary Embodiment\>

Hereinafter, a second exemplary embodiment according to the present invention will be described. In addition, in the description of this second exemplary embodiment, an element having the same name as the element in the first exemplary embodiment is denoted by the same sign as the element in the first exemplary embodiment, and the duplicating description of the element denoted the same sign will be omitted.

Figure 6:
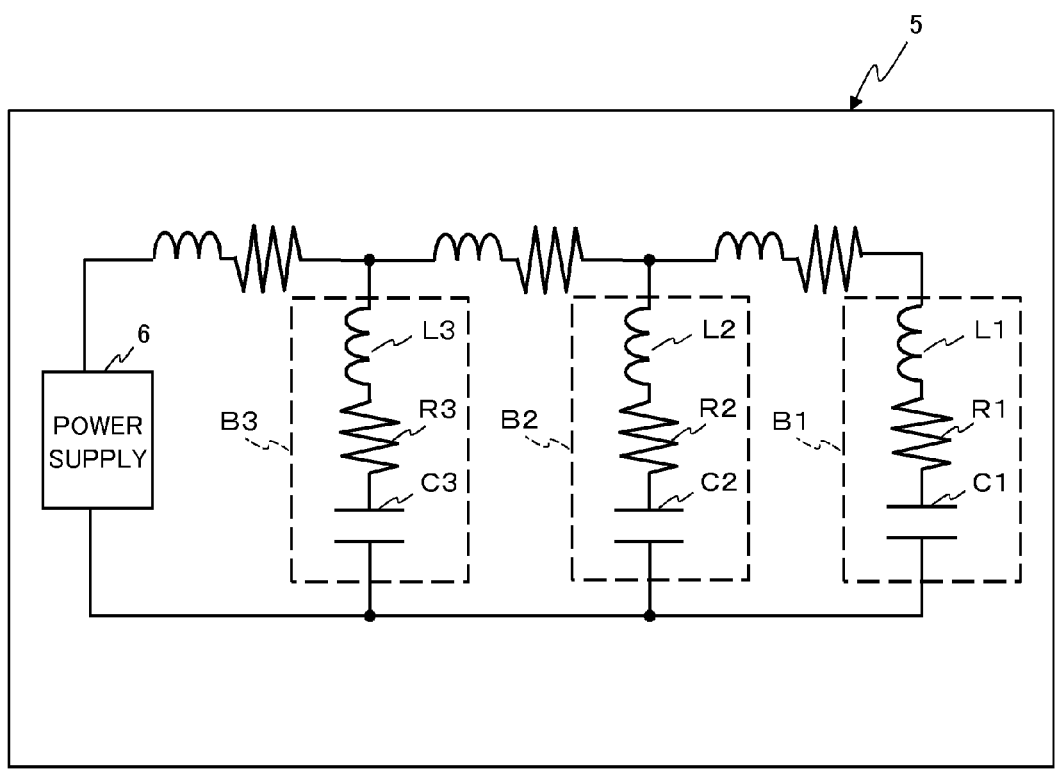
FIG. 6 is a circuit diagram illustrating an equivalent circuit of the measurement-target electric circuit in a second exemplary embodiment according to the present invention.

A measurement device 1 of this second exemplary embodiment includes an electric current generation circuit 2 and a monitor device 3 just like in the first exemplary embodiment. An electric circuit 5 which is a measurement target to the measurement device 1 is a power distribution network (hereinafter, the electric circuit 5 will be also referred to as a power distribution network (PDN) 5). The PDN 5 is configured such that a power supply 6, LSI (semiconductor integration circuits) and electronic components, such as capacitors, are mounted on a circuit board (printed circuit board (PCB)). FIG. 6 is a circuit diagram illustrating an equivalent circuit of the PDN (electric circuit) 5 in this second exemplary embodiment. As also shown in FIG. 6, the PDN 5 is a network of LRC circuit including a capacitance element (C), an inductance element (L) and a resistance element (R). In addition, a part enclosed by a dotted line B1 in FIG. 6 is a part associated with the LSI (semiconductor integration circuit). A part enclosed by a dotted line B2 is a part associated with the electronic component. A part enclosed by a dotted line B3 is a part associated with the circuit board (printed circuit board (PCB)).

The monitor device 3 is configured to measure (monitor) a voltage of the power supply 6 in the PDN 5. As having been described in the first exemplary embodiment, based on a frequency of the waveform of the voltage measured by this monitor device 3, it is possible to obtain the frequencies f1 and f2 (refer to FIG. 4) at each of which the impedance (the power source impedance) of the PDN 5 becomes high. Further, for example, a circuit designer adjusts the power source impedance of the PDN 5 so that each of the frequencies f1 and f2 obtained in such a way described above does not match with any one of an operation frequency of the PDN 5 (that is, a clock frequency of the semiconductor integration circuit) and a frequency n times the operation frequency and a frequency 1/n (one nth) times the operation frequency (n being a positive integer).

Specifically, the circuit designer adjusts the power source impedance of the PDN 5 in view of the frequencies f1 and f2 by increasing/decreasing a capacitance amount of each of capacitance elements C1 to C3 in the equivalent circuit shown in FIG. 6. Alternatively, the circuit designer adjusts the power source impedance of the PDN 5 in view of the frequencies f1 and f2 by utilizing a member having a resistance element or filter having a resistance element, and changing a resistance amount of each of resistance elements R1 to R3 and an inductance amount of each of inductance elements L1 to L3. In this way, through the adjustment of the power source impedance in view of the frequencies f1 and f2, increasing of the level of noise superimposed on the electric current and the signal (i.e., power source noise) in the PDN 5 is suppressed. Further, the utilization of a simulation based on the equivalent circuit shown in FIG. 6 in the adjustment of the power source impedance of the PDN 5 makes the adjustment work more efficient.

Figure 7:
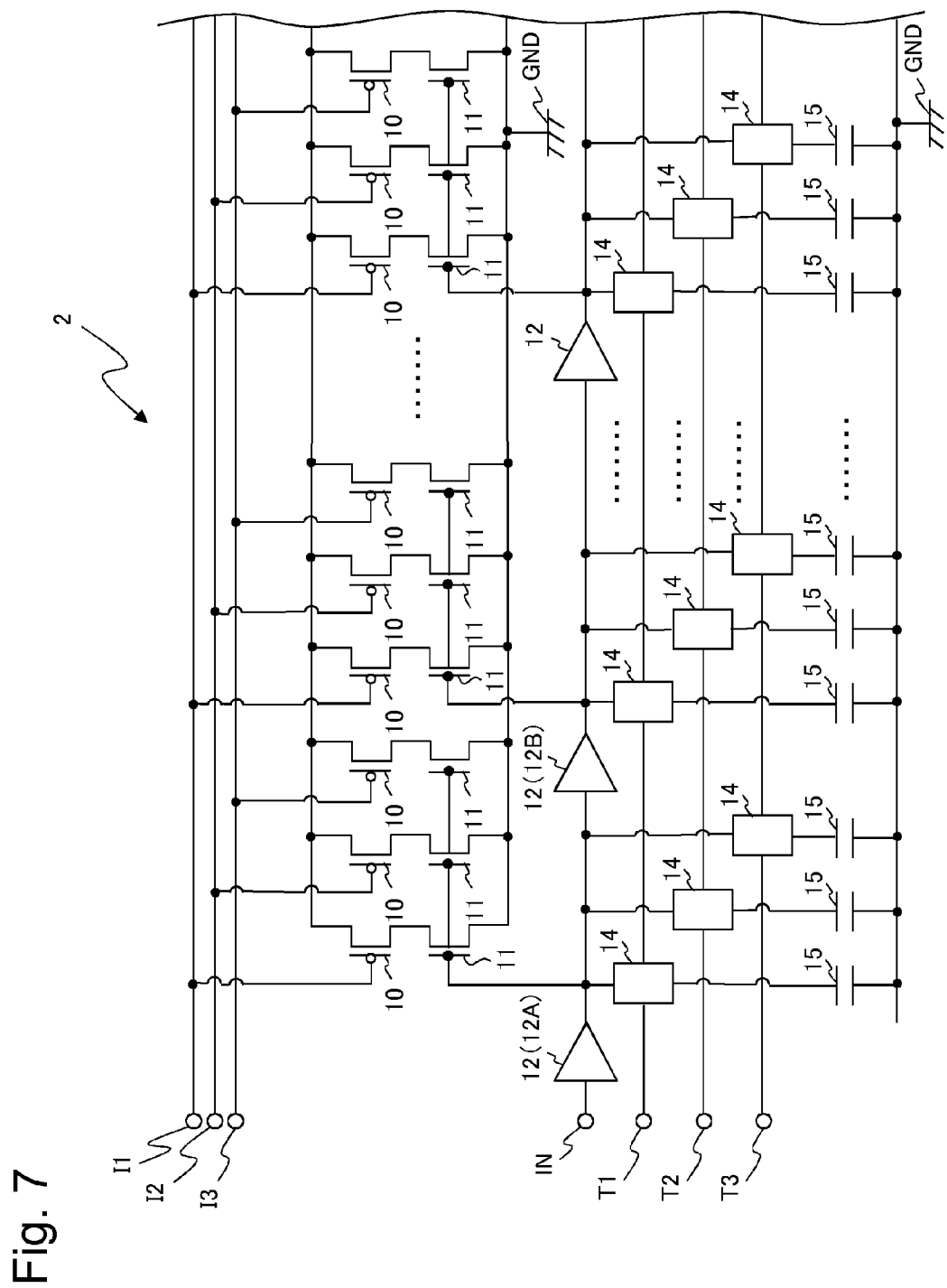
FIG. 7 is a circuit diagram illustrating a specific example of a circuit configuration of an electric current generation circuit in the second exemplary embodiment.

In this second exemplary embodiment, a specific example of a circuit configuration of the electric current generation circuit 2 will be described. FIG. 7 is a circuit diagram illustrating a specific example of a circuit configuration of the electric current generation circuit 2. In this example shown in FIG. 7, the electric current is generated by allowing a flow-through current to flow through P channel transistors 10 and N channel transistors 11. Further, the P channel transistors 10 are controlled to switch ON state and OFF state by a signal inputted via one of input ports I1, I2 and I3 selected through a selector (not illustrated). Further, in FIG. 7, a plurality of drivers 12 are connected in series. Each of the gates of the N channel transistors 11 is connected to the output of the driver 12. Moreover, each of the outputs of the drivers 12 is also connected to a plurality of capacitors 15 through a switch 14 related thereto. Each of the switches 14 is controlled to switch ON state and OFF state by a control signal inputted via one of input ports T1, T2 and T3 from a control circuit (not illustrated).

The electric current generation circuit 2 shown in FIG. 7 operates as described below. In addition, the electric current level of each of the input ports I1 to I3 is in the state of being fixed to a preset level.

When an electric current level at an input port IN is "0", an amount of an electric current supplied from the electric current generation circuit 2 to the PDN 5 is "0" amperes [A]. When the electric current level at the input port IN changes from "0" to "1", an output level of the first-stage driver 12(12A) changes from "0" to "1". As a result, the electric current flows through the N channel transistors 11 connected to the output of the driver 12A. Subsequently, after an elapse of a delay time of the driver 12, the output level of the second-stage driver 12(12B) changes from "0" to "1", and the electric current flows through the N channel transistors 11 connected to the output of the driver 12B. As a result of repeating this operation, the electric current generation circuit 2 generates an electric current which, as shown in FIG. 2, monotonically increases during the setup period of time Δt, and supplies the generated electric current to the PDN 5.

Meanwhile, a delay time (here, denoted by Tr) from a beginning of the input of the electric current having the electric current level "1" to the driver 12(12A) until the input of the electric current having the electric current level "1" into the next driver 12(12B) can be adjusted by using the capacitor 15 connected to the driver 12. That is, in the circuit configuration shown in FIG. 7, the capacitance amount of capacitance element associated with the delay time Tr can be changed by on/off switching control in the switch 14 through level control of each of control signals inputted respectively to the input ports T1 to T3. In the circuit shown in FIG. 7, three capacitors 15 are connected to between the drivers 12A and 12B which are connected in series. In the case where it is supposed that these capacitors 15 have mutually different capacitance amount, it is possible to change a total capacitance amount associated with the delay time Tr to any one of eight capacitance levels by performing switching control of the three switches 14, using a signal consisting of three bits.

The delay time Tr is a main factor which determines the period of time Δt during which the electric current outputted by the electric current generation circuit 2 monotonically increases, and thus, it is possible to adjust the period of time Δt by adjusting the delay time Tr in such a way as described above. Further, as described above, the frequency element included in the electric current outputted from the electric current generation circuit 2 is changed by adjusting the period of time Δt in such a way as described above. Thus, through this method, the circuit shown in FIG. 7 is capable of changing the frequency of the voltage waveform measured by the monitor device 3 to the frequency f1 or the frequency f2 shown in FIG. 4.

That is, the circuit shown in FIG. 7 is capable of measuring a plurality of frequencies at each of which the power source impedance of the PDN 5 becomes high. Accordingly, the measurement device 1 of this second exemplary embodiment becomes capable of making the adjustment of the power source impedance of the PDN 5 easier by including the electric current generation circuit 2 which has the circuit configuration shown in FIG. 7. That is, the measurement device 1 of this second exemplary embodiment brings about an advantageous effect that the level of the power supply noise of the PDN 5 can be efficiently reduced.

Moreover, the circuit shown in FIG. 7 has a function described below. That is, the electric current level at each of the input ports I1 to I3 is switched to "0" or "1" by, for example, a control circuit (not illustrated). This switching control of the electric current level at each of the input ports I1 to I3 causes P channel transistors 10 connected to the each of the input ports I1 to I3 to switch their respective ON/OFF states. Through this switching control, it is possible to change the size of an electric-current variation range (increase range) ΔI, shown in FIG. 2, with respect to the electric current outputted from the electric current generation circuit 2. Here, it is supposed that the circuit shown in FIG. 7 is configured such that an amount of a flow-through current flowing between a source and a drain in one of three P channel transistors 10 connected respectively to the input ports I1 to I3 is different from the amount of the flow-through current flowing between the source and the drain in the other P channel transistor 10. In this case, it is possible to change the size of electric-current variation range ΔI to any one of eight sizes of electric current amounts by performing switching control of the three P channel transistors 10, using a control signal consisting of three bits.

Consequently, the measurement device 1 including the electric current generation circuit 2 which has the circuit configuration shown in FIG. 7 brings about the following advantageous effects. For example, when the monitor device 3 attempts to measure the voltage waveform having the frequency f1 shown in FIG. 4, at which the power source impedance becomes high, the monitor device 3 is likely to be damaged in the case where the amplitude of the voltage waveform is too large. In this case, the measurement device 1 can prevent the occurrence of such the damage problem on the monitor device 3 by causing the electric current generation circuit 2 to restrict the size of the electric-current variation range ΔI. Further, when the monitor device 3 attempts to measure the voltage waveform having the frequency f2 shown in FIG. 4, at which the power source impedance becomes high, there occurs a case where the amplitude of the voltage waveform is too small for the monitor device 30 to make a measurement with high accuracy. In this case, the measurement device 1 is capable of making the amplitude of the voltage waveform measured by the monitor device 3 suitable for the measurement by causing the electric current generation circuit 2 to make the size of the electric-current variation range ΔI larger.

Consequently, through such variable control of the size of the electric-current variation range ΔI in the electric current generation circuit 2, the measurement device 1 brings about an advantageous effect that it becomes possible to realize a measurement with high accuracy, simultaneously with ensuring the reliability of a measurement-target device by keeping the resistance property thereof.

<Third Exemplary Embodiment>

Hereinafter, a third exemplary embodiment according to the present invention will be described. In addition, in the description of this third exemplary embodiment, an element having the same name as the element in the first or the second exemplary embodiment is denoted by the same sign as the element in the first or the second exemplary embodiment, and the duplicating description of the element denoted the same sign will be omitted.

A measurement device 1 of this third exemplary embodiment includes the electric current generation circuit 2 and the monitor device 3. In this third exemplary embodiment, the electric current generation circuit 2 has the same circuit configuration as that of the electric current generation circuit 2 of the first or the second exemplary embodiment. The monitor device 3 includes a frequency counter. The monitor device 3 including such the frequency counter outputs a numerical value corresponding to a frequency of a detected voltage waveform. This configuration makes it easy to perform the work to increase/decrease the number of parts (components), such as capacitors, inductors and resistors, and the work to change the kinds of the parts (components), the purpose of these works being a reduction of the level of the power source noise of the PDN 5 through the adjustment of the power source impedance of the PDN 5.

Figure 8:
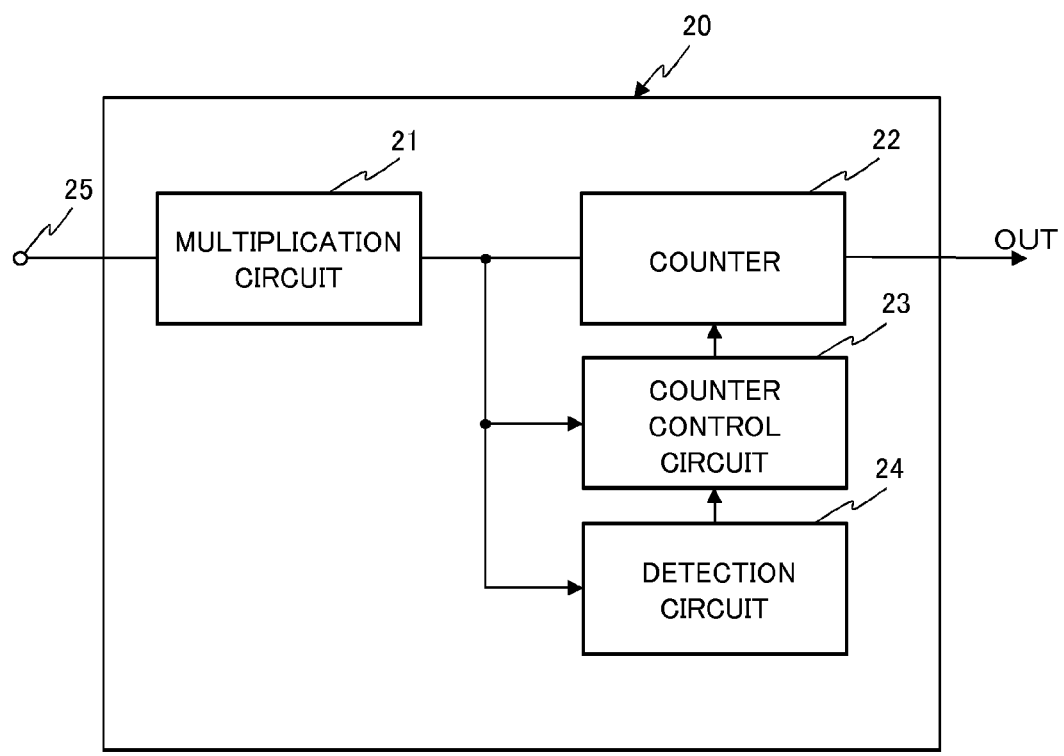
FIG. 8 is a simplified block diagram illustrating a configuration of a frequency counter included in a monitor device in a third exemplary embodiment according to the present invention.

FIG. 8 is a simplified block diagram illustrating a circuit configuration of a frequency counter 20 constituting the monitor device 3. The Frequency counter 20 shown in FIG. 8 includes a multiplication circuit 21, a counter 22, a counter control circuit 23 and a detection circuit 24. This frequency counter 20 receives a clock signal through an input port 25.

The multiplication circuit 21 includes a circuit configured to multiply the clock signal which is inputted through the input port 25. The counter 22 includes a circuit configured to count the number of clocks of the clock signal outputted from the multiplication circuit 21.

Figure 9:
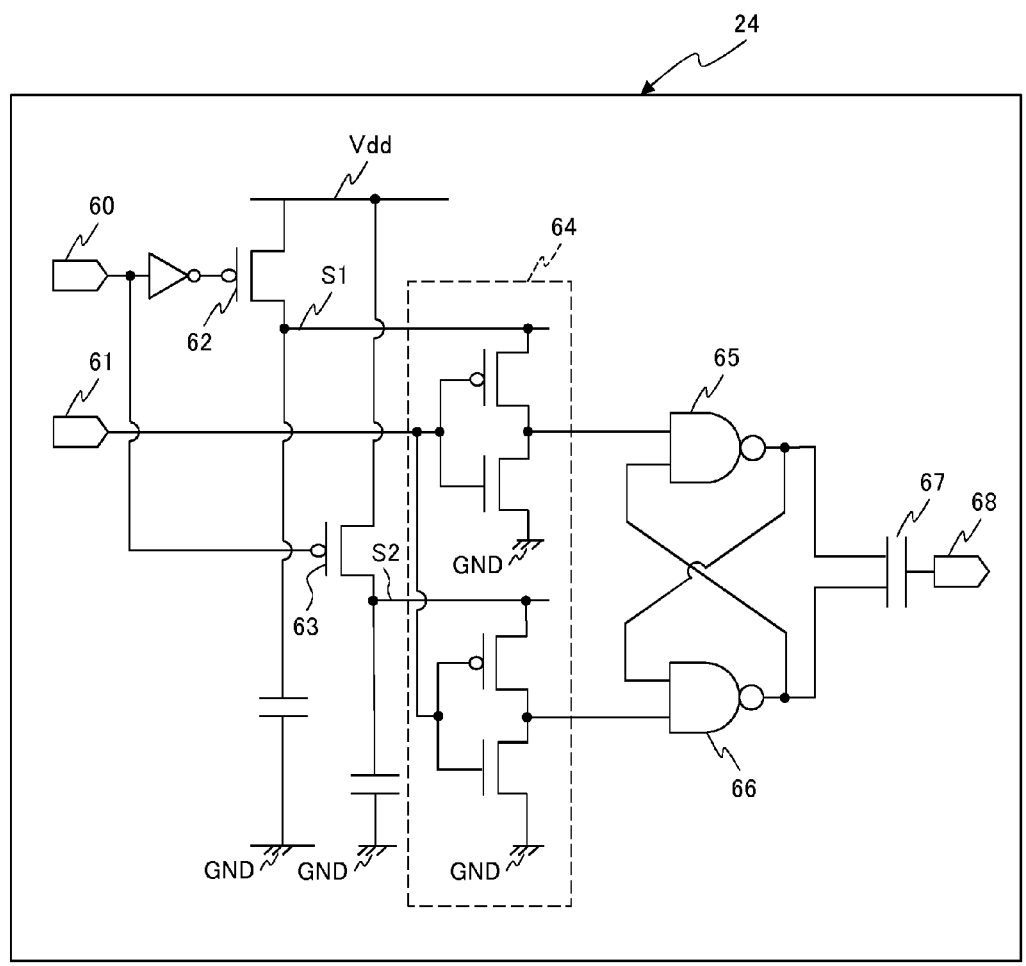
FIG. 9 is a circuit diagram illustrating a specific example of a circuit configuration of a detection circuit constituting the frequency counter shown in FIG. 8.
Figure 10:
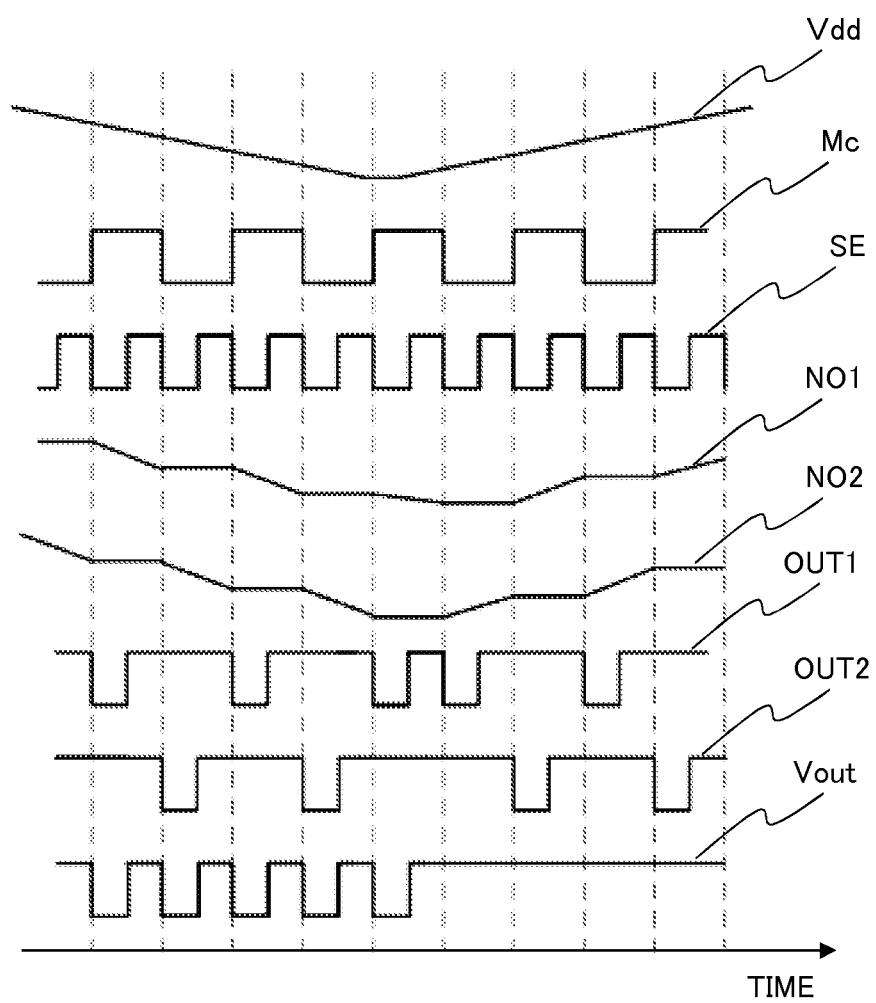
FIG. 10 is a time chart illustrating an example of operation of the circuit shown in FIG. 9.

The detection circuit 24 includes a circuit configured to detect whether a measurement-target power source voltage of the PDN 5 is in an ascending trend or in a descending trend. FIG. 9 is a circuit diagram illustrating a specific example of a circuit configuration of the detection circuit 24. FIG. 10 is a time chart illustrating circuit operations of the circuit shown in FIG. 9.

In the circuit shown in FIG. 9, a signal Mc shown in FIG. 10 is inputted to an input port 60. This signal Mc is a rectangular-wave shaped signal having the same cycle as that of the detection of the power source voltage of the PDN 5. This signal Mc causes each of P channel transistors 62 and 63 to perform switching between ON state and OFF state. A drain of each of the P channel transistors 62 and 63 is connected to the PDN 5, and one of the P channel transistors 62 and 63 takes a power supply voltage Vdd of the PDN 5 at every rising edge of the signal Mc; while the other one of the P channel transistors 62 and 63 takes a power supply voltage Vdd of the PDN 5 at every falling edge of the signal Mc, which is anterior to the rising edge of the signal Mc by a half cycle of the signal Mc. Through this operation, an electric potential of the source of the P channel transistor 62 and an electric potential of the source of the P channel transistor 63 vary just like an electric potential NO 1 and an electric potential NO 2, which are illustrated in FIG. 10, respectively.

Further, in the circuit shown in FIG. 9, a signal SE shown in FIG. 10 is inputted to an input port 61. This signal SE performs control of operation of an inverter circuit 64. Through the operation of this inverter circuit 64, a signal OUT 1 shown in FIG. 10 appears at the output side of a NAND circuit 65, and a signal OUT 2 shown in FIG. 10 appears at the output side of a NAND circuit 66. In the circuit shown in FIG. 9, although the signals OUT 1 and OUT 2 are alternately outputted in accordance with the change of a voltage level of the signal Mc, a signal Vout outputted from an output port 68 becomes a waveform shown in FIG. 10 because of an involvement of a holding voltage of a capacitor 67. That is, when the power supply voltage Vdd is in the ascending trend, the signal Vout becomes in the state where its voltage level is fixed to "1", and when the power supply voltage Vdd is in the descending trend, the signal Vout becomes a signal having a clock waveform whose voltage level periodically and alternately changes to "1" and "0".

The counter control circuit 23 shown in FIG. 8 is configured to, based on a detected result by the detection circuit 24, control the counter 22 so that the counter 22 starts a counting operation at timing when the power source voltage Vdd of the PDN 5 changes from the descending trend to the ascending trend. Further, the counter control circuit 23 is configured to, based on a detected result by the detection circuit 24, control the counter 22 so that the counter 22 outputs a count value as a result of the counting operation at timing when the power source voltage Vdd of the PDN 5 changes to the ascending trend.

Figure 11:
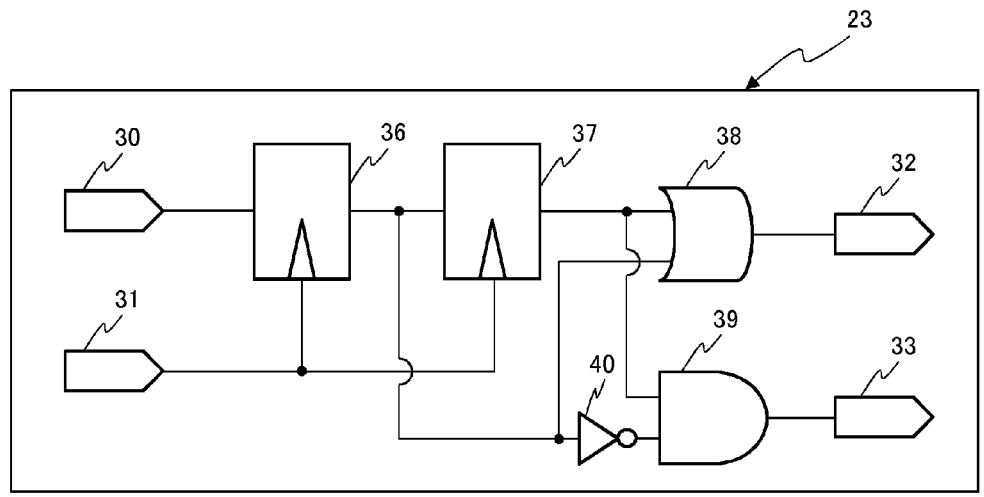
FIG. 11 is a circuit diagram illustrating a specific example of a circuit configuration of a counter control circuit shown in FIG. 8.
Figure 12:
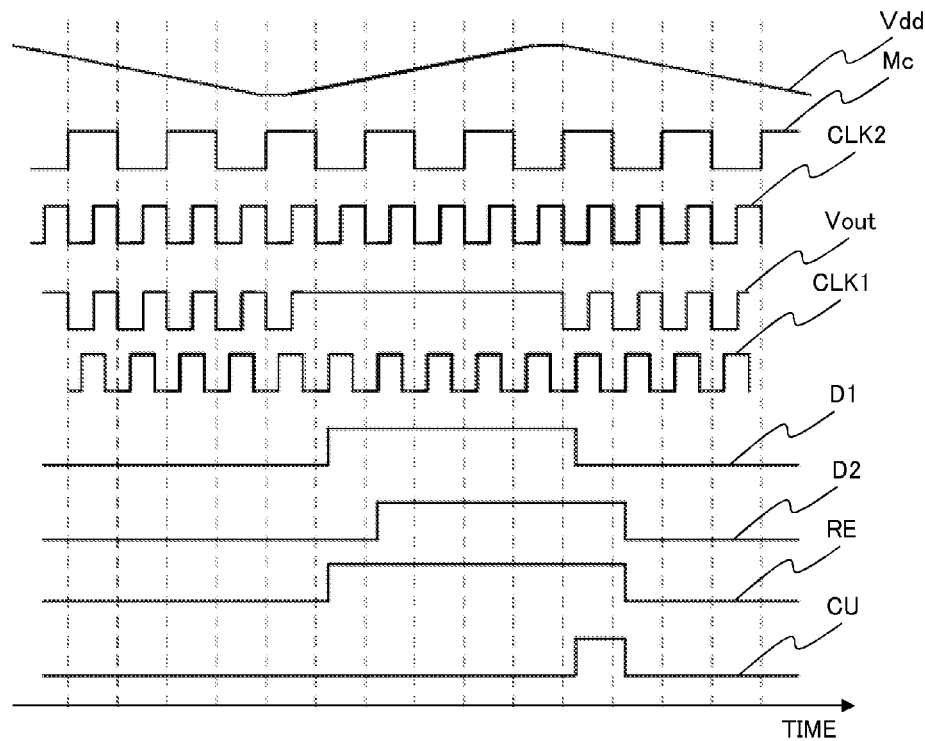
FIG. 12 is a time chart illustrating an example of operation of the circuit shown in FIG. 11.

FIG. 11 is a circuit diagram illustrating a specific example of a circuit configuration of the counter control circuit 23. FIG. 12 is a time chart illustrating a circuit operation of the circuit shown in FIG. 11. In the counter control circuit 23 shown in FIG. 11, the signal Vout shown in FIG. 12 is inputted to an input port 30 from the detection circuit 24. As described above, this signal Vout is a signal having a clock waveform whose voltage level periodically and alternately changes to "1" and "0" when the measurement-target power source voltage Vdd of the PDN 5 is in the descending trend. Further, the signal Vout is in the state where its voltage level is fixed to "1" when the power source voltage Vdd is in the ascending trend.

In the circuit shown in FIG. 11, a clock signal CLK1 shown in FIG. 12 is inputted to an input port 31. Further, a flip-flop circuit 36 uses a clock signal CLK2 shown in FIG. 12. This flip-flop circuit 36 outputs a signal D1 shown in FIG. 12 in accordance with the output signal Vout of the detection circuit 24. A flip-flop circuit 37 takes the output signal D1 of the flip-flop circuit 36, and outputs a signal D2 shown in FIG. 12, which has the same waveform as that of the signal D1 and is delayed from the signal D1 by one cycle of the clock signal CLK 1.

The outputs of the flip-flop circuits 36 and 37 are connected to an OR circuit 38. As a result, a reset signal RE shown in FIG. 12 is outputted from an output port 32 connected to the OR circuit 38, based on the output signals of the flip-flop circuits 36 and 37. This signal RE causes the counter 22 to become in the state of being released from a reset when the power source voltage Vdd is in the ascending trend, so that the counter 22 performs counting operations.

Moreover, the output of the flip-flop circuit 36 is connected to an AND circuit 39 via a NOT circuit 40, and further, the output of the flip-flop circuit 37 is also connected to the AND circuit 39. Through this configuration, a signal CU shown in FIG. 12 is outputted from an output port 33 connected to the AND circuit 39, based on the output signals of the flip-flop circuits 36 and 37. This signal CU causes the counter 22 to output a count value at timing when the power source voltage Vdd has changed from the ascending trend to the descending trend.

The measurement device 1 of this third exemplary embodiment brings about an advantageous effect of becoming capable of outputting a measurement result which makes the adjustment of the power source impedance of the PDN 5 easier by including the frequency counter 20 having such a circuit configuration as described above.

<Fourth Exemplary Embodiment>

Hereinafter, a fourth exemplary embodiment according to the present invention will be described. In addition, in the description of this fourth exemplary embodiment, an element having the same name as the element in the first to third exemplary embodiments is denoted by the same sign as the element in the first to third exemplary embodiments, and the duplicating description of the element denoted the same sign will be omitted.

A measurement device 1 of this fourth exemplary embodiment also includes the electric current generation circuit 2 and the monitor device 3 just like each of the first to third exemplary embodiments. The electric current generation circuit 2 has the same circuit configuration as that having been described in the first or the second exemplary embodiment. Meanwhile, the monitor device 3 includes a noise comparison circuit described below in addition to the configuration having been described in any one of the first to third exemplary embodiments.

Figure 13:
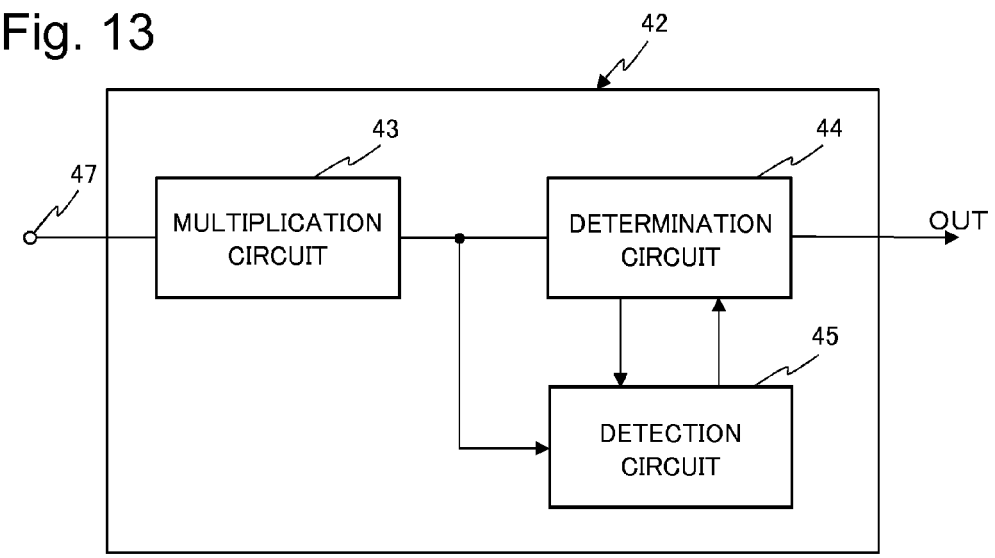
FIG. 13 is a simplified block diagram illustrating a configuration of a noise comparison circuit included in a monitor device in a fourth exemplary embodiment according to the present invention.

FIG. 13 is a simplified block diagram illustrating a configuration of the noise comparison circuit. A noise comparison circuit 42 shown in FIG. 13 includes a multiplication circuit 43, a determination circuit 44 and a detection circuit 45. An input port 47 of this noise comparison circuit 42 receives a clock signal. The multiplication circuit 43 includes a circuit configured to multiply the clock signal inputted to the input port 47. The detection circuit 45 has a function of retaining (storing) a voltage level of the power source voltage as a threshold value. Moreover, the detection circuit 45 has a function of comparing the voltage level of the power source voltage of the PDN 5, which is a target of the measurement, with the retained voltage level (the threshold value), and determining whether or not the voltage level of the power source voltage is lower than the threshold value.

The determination circuit 44 has a function of outputting a noise detection signal for notifying the detection of noise when the voltage level of the power source voltage is lower than the threshold value, based on the comparison result outputted from the detection circuit 45. Moreover, when the voltage level of the power source voltage is lower than the threshold value as described above, the determination circuit 44 outputs a detected peak voltage level of the power source voltage to the detection circuit 45. Moreover, the determination circuit 44 has a function of determining whether the voltage level of the power source voltage as the threshold value is to be continuously retained or to be updated by the detection circuit 45.

Figure 14:
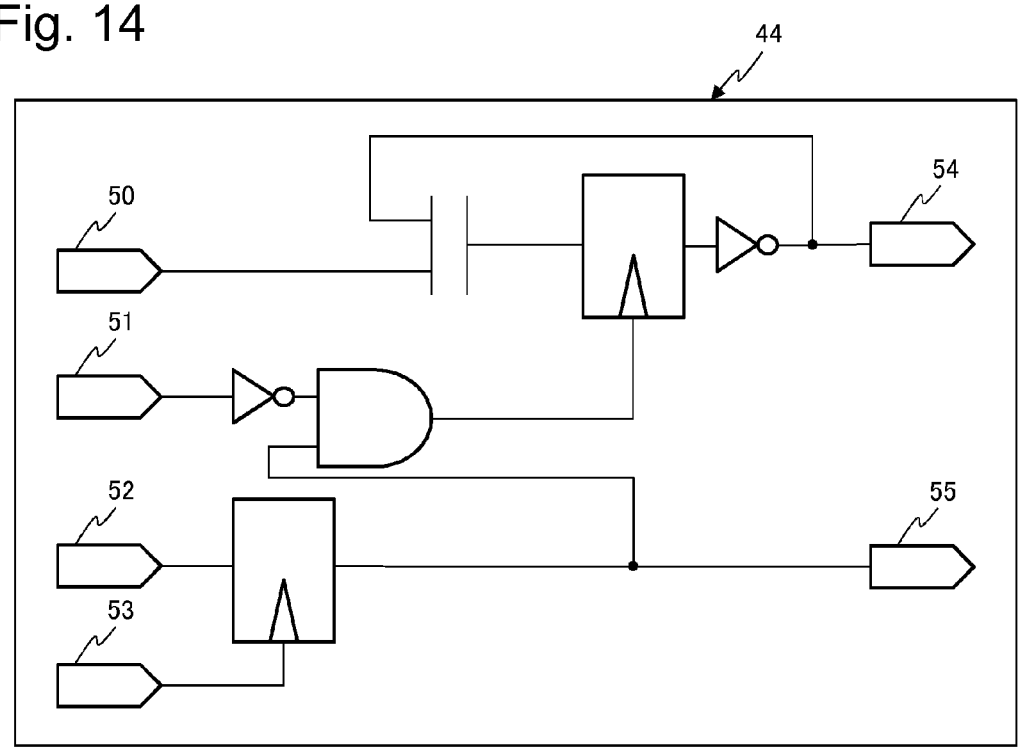
FIG. 14 is a circuit diagram illustrating a specific example of a circuit configuration of a determination circuit shown in FIG. 13.
Figure 15:
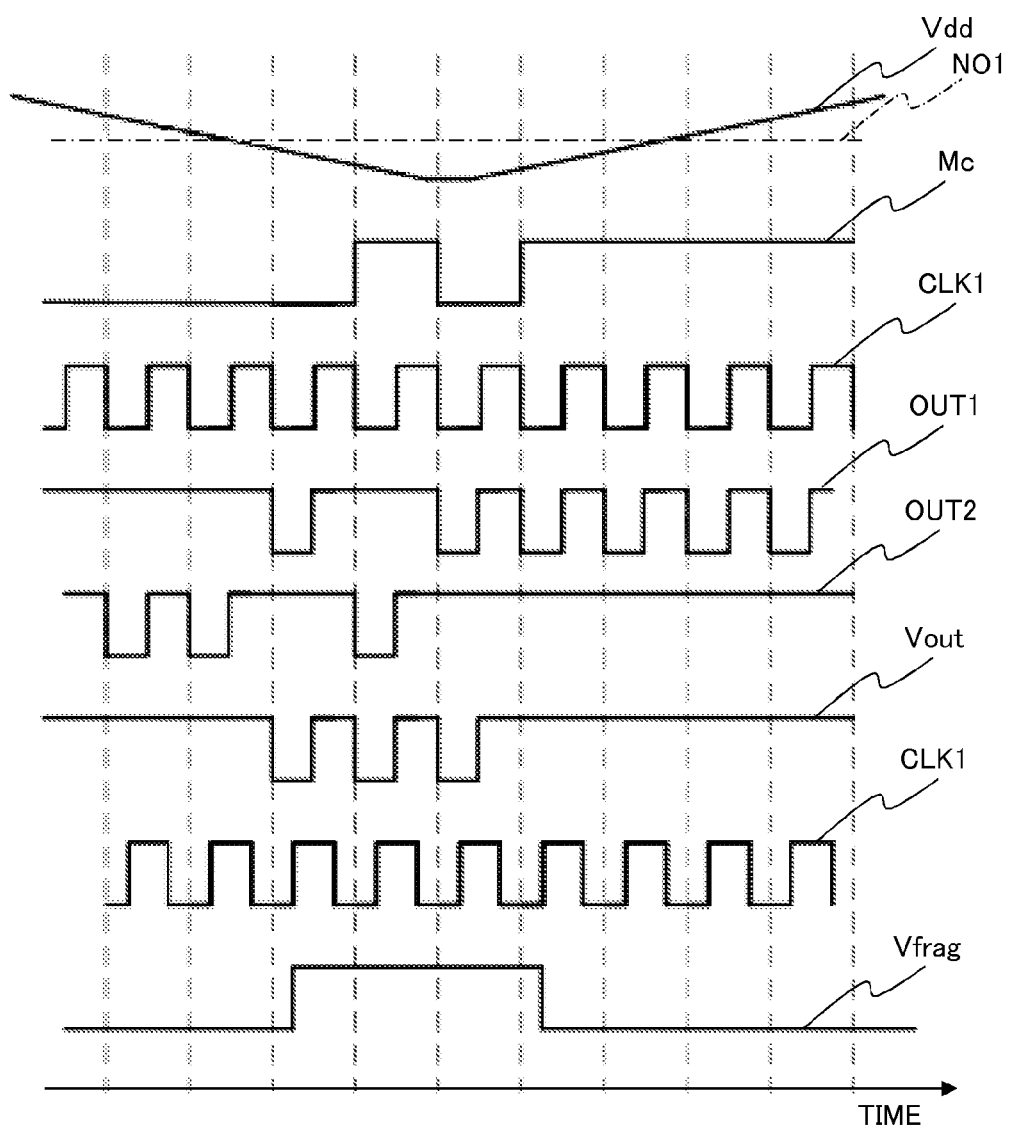
FIG. 15 is a time chart illustrating an example of operation of the circuit shown in FIG. 14.

FIG. 14 is a circuit diagram illustrating a specific example of a circuit configuration of the determination circuit 44. FIG. 15 is a time chart illustrating a circuit operation of the circuit shown in FIG. 14. In addition, here, it is supposed that the detection circuit 45 connected to the determination circuit 44 has a circuit configuration shown in FIG. 9, and retains a threshold value NO1.

For example, in the determination circuit 44 shown in FIG. 14, the rectangular-wave shaped signal Mc (for example, refer to FIG. 10) having a setup frequency is inputted to an input port 50. A clock signal CLK1 shown in FIG. 15 is inputted to an input port 51. Further, it is supposed that the signal Vout (the output of the detection circuit 45)

having a waveform shown in FIG. 15 is inputted to an input port 52. Moreover, it is supposed that a clock signal CLK 2 shown in FIG. 15 is inputted to an input port 53. Under such a configuration as described above, in the circuit shown in FIG. 14, when the power source voltage Vdd of the PDN 5 is in the descending trend and further is larger than or equal to the threshold value NO1, the signal Mc outputted from an output port 54 is fixed to "0". Further, when the power source voltage Vdd of the PDN 5 is smaller than the threshold value NO1, the signal Mc outputted from the output port 54 becomes a clock signal whose voltage level periodically and alternately changes to "0" and "1". Moreover, when the power source voltage Vdd of the PDN 5 is in the ascending trend and further is larger than or equal to the threshold value NO1, the signal Mc outputted from the output port 54 is fixed to "1".

Further, in the circuit shown in FIG. 14, when the power source voltage Vdd of the PDN 5 is lower than the threshold value NO1, an output signal Vfrag shown in FIG. 15 is outputted from an output port 55. That is, in the circuit shown in FIG. 14, when the power source voltage Vdd of the PDN 5 is smaller than the threshold value NO1, the signal Vfrag having the voltage level "1" is outputted.

The monitor device 3 brings about not only the aforementioned advantageous effects but also the following advantageous effects by including the noise comparison circuit 42 which operates in such a way as described above. That is, the monitor device 3 becomes capable of outputting a result of a comparison of the level of the peak electric potential (power source noise) of a detected voltage waveform with respect to the measurement-target PDN 5 with the level of the peak electric potential (power source noise) of the detected voltage waveform with respect to the PDN 5 which is in the state after the adjustment of the power source impedance thereof.

The measurement device 1 including the monitor device 3 which operates in such a way as described above brings about, besides the aforementioned advantageous effects, an advantageous effect that the reduction of the level of the power source noise of the PDN 5 which is in the state after the adjustment of the power source impedance thereof can be easily confirmed, so that the reliability of the PDN 5 can be improved.

<Other Exemplary Embodiments>

It is to be noted that, without being limiting to the first to fourth exemplary embodiments, the present invention can be embodied in various configurations. For example, in the second exemplary embodiment, the electric current generation circuit 2 includes the circuit configured to be capable of making the variable adjustment of the time length of the period of time Δt during which the electric current amount of the generated electric current monotonically increases. In this regard, in the case where, for example, it is prescribed in a specification that only one of the frequencies at each of which the power source impedance of the PDN 5 targeted for this measurement becomes high is to be measured, the electric current generation circuit 2 may not include such the circuit configured to be capable of making the variable adjustment of the time length of the period of time Δt.

Further, in the second exemplary embodiment, the electric current generation circuit 2 includes the circuit configured to be capable of making the variable adjustment of the size of the variation range ΔI of the generated electric current whose amount monotonically increases. In this regard, in the case where, for example, it is supposed that the circuit configuration of the PDN 5 targeted for each of measurements is not largely changed, there is a case where the amplitudes of voltage waveforms detected by the monitor device 3 are supposed to be almost the same independent of the types of the PDN 5. In such that case, the electric current generation circuit 2 may not include such the circuit configured to be capable of making the variable adjustment of the size of the variation range ΔI with respect to the generated electric current.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A measurement device comprising:
   an electric current generating circuit that supplies a measurement-target electric circuit including a power supply with an electric current whose electric current amount monotonically increases during a setup period of time; and
   a monitoring device that detects a waveform of a voltage of the power supply via the electric circuit and retains information depending on a peak electric potential of the voltage detected and outputs a signal depending on a comparison result obtained by comparing the peak electric potentials of the voltage detected which are different from each other in the measurement-target electric circuit.

2. The measurement device according to claim 1, wherein the electric current generating circuit includes a circuit configured to adjust a time length of the setup period of time.

3. The measurement device according to claim 1, wherein the electric current generating circuit includes a circuit configured to adjust a variation time range of the electric current which monotonically increases.

4. The measurement device according to claim 1, wherein the monitoring device is configured to output information relating to a waveform of the detected voltage.

5. The measurement device according to claim 1, wherein the monitoring device includes a frequency counter which outputs a signal depending on a frequency of the detected voltage.

6. A semiconductor device comprising:
   a power distribution network that is an electric circuit including a power supply and a semiconductor integration circuit; and
   a measurement device according to claim 1, which handles the power distribution network as a measurement-target electric circuit.

7. An impedance adjustment method comprising:
   detecting a frequency of which an impedance of a measurement-target electric circuit becomes high, based on a waveform of a voltage detected by a monitoring device, the monitoring device detecting the waveform of the voltage of a power supply via the measurement-target electric circuit in a state of supplying the measurement-target electric circuit with an electric current whose electric current amount monotonically increases during a setup period of time; and adjusting the impedance of the measurement-target electric circuit by utilizing a simulation so that the detected frequency and a driving frequency of the measurement-target electric circuit are different.

* * * * *